(12) United States Patent
Tseng et al.

(10) Patent No.: US 10,056,869 B2
(45) Date of Patent: Aug. 21, 2018

(54) POWER AMPLIFIER SYSTEM AND ASSOCIATED CONTROL CIRCUIT AND CONTROL METHOD

(71) Applicant: MEDIATEK INC., Hsin-Chu (TW)

(72) Inventors: Chien-Wei Tseng, Keelung (TW);
Ming-Da Tsai, Miaoli County (TW)

(73) Assignee: MEDIATEK INC., Hsin-Chu (TW)

( * ) Notice: Subject to any disclaimer, the term of this patent is extended or adjusted under 35 U.S.C. 154(b) by 20 days.

(21) Appl. No.: 15/348,956

(22) Filed: Nov. 10, 2016

(65) Prior Publication Data
US 2017/0207758 A1      Jul. 20, 2017

Related U.S. Application Data

(60) Provisional application No. 62/280,716, filed on Jan. 20, 2016.

(51) Int. Cl.
| H03F 3/04 | (2006.01) |
| H03F 3/21 | (2006.01) |
| H03F 1/32 | (2006.01) |
| H03F 1/02 | (2006.01) |
| H03F 1/14 | (2006.01) |
| H03F 3/193 | (2006.01) |

(52) U.S. Cl.
CPC ............. *H03F 3/21* (2013.01); *H03F 1/0266* (2013.01); *H03F 1/14* (2013.01); *H03F 1/3205* (2013.01); *H03F 1/3276* (2013.01); *H03F 3/193* (2013.01); *H03F 2200/213* (2013.01); *H03F 2200/222* (2013.01); *H03F 2200/228* (2013.01); *H03F 2200/435* (2013.01); *H03F 2200/451* (2013.01); *H03F 2200/465* (2013.01); *H03F 2200/471* (2013.01); *H03F 2200/546* (2013.01); *H03F 2200/555* (2013.01); *H03F 2200/75* (2013.01); *H03F 2200/78* (2013.01); *H03F 2201/3215* (2013.01)

(58) Field of Classification Search
CPC .......... H03F 3/21; H03F 1/3276; H03F 3/193; H03F 1/3205; H03F 1/14; H03F 1/0266
USPC .............................. 330/296, 207 P, 136, 253
See application file for complete search history.

(56) References Cited

U.S. PATENT DOCUMENTS

| 6,828,858 B2 | 12/2004 | Larson et al. |
| 7,567,123 B2 | 7/2009 | Leung et al. |
| 8,787,850 B2 | 7/2014 | Bockelman et al. |
| 2005/0184802 A1 | 8/2005 | Taylor |
| 2008/0303591 A1 | 12/2008 | Wang |

(Continued)

*Primary Examiner* — Khanh V Nguyen
*Assistant Examiner* — Khiem Nguyen
(74) *Attorney, Agent, or Firm* — Winston Hsu (57) ABSTRACT

A control circuit of a power amplifier includes a peak detector, a first comparator, a first current source, a second comparator, a second current source and a bias circuit. The peak detector is arranged for detecting an amplitude of an input signal. The first comparator is arranged for comparing the amplitude of the input signal with a first threshold to generate a first comparing result. The first current source is arranged for generating a first current according to the first comparing result. The second comparator is arranged for comparing the amplitude of the input signal with a second threshold to generate a second comparing result. The second current source is arranged for generating a second current according to the second comparing result. The bias circuit is arranged for generating a bias voltage according to the first current and the second current to the power amplifier.

24 Claims, 7 Drawing Sheets

(56) References Cited

U.S. PATENT DOCUMENTS

2011/0074509 A1    3/2011    Samavedam
2014/0266432 A1    9/2014    Scott

POWER AMPLIFIER SYSTEM AND ASSOCIATED CONTROL CIRCUIT AND CONTROL METHOD

CROSS REFERENCE TO RELATED APPLICATIONS

This application claims the priority of U.S. Provisional Application No. 62/280,716, filed on Jan. 20, 2016, which is included herein by reference in its entirety.

BACKGROUND

Figure 1:
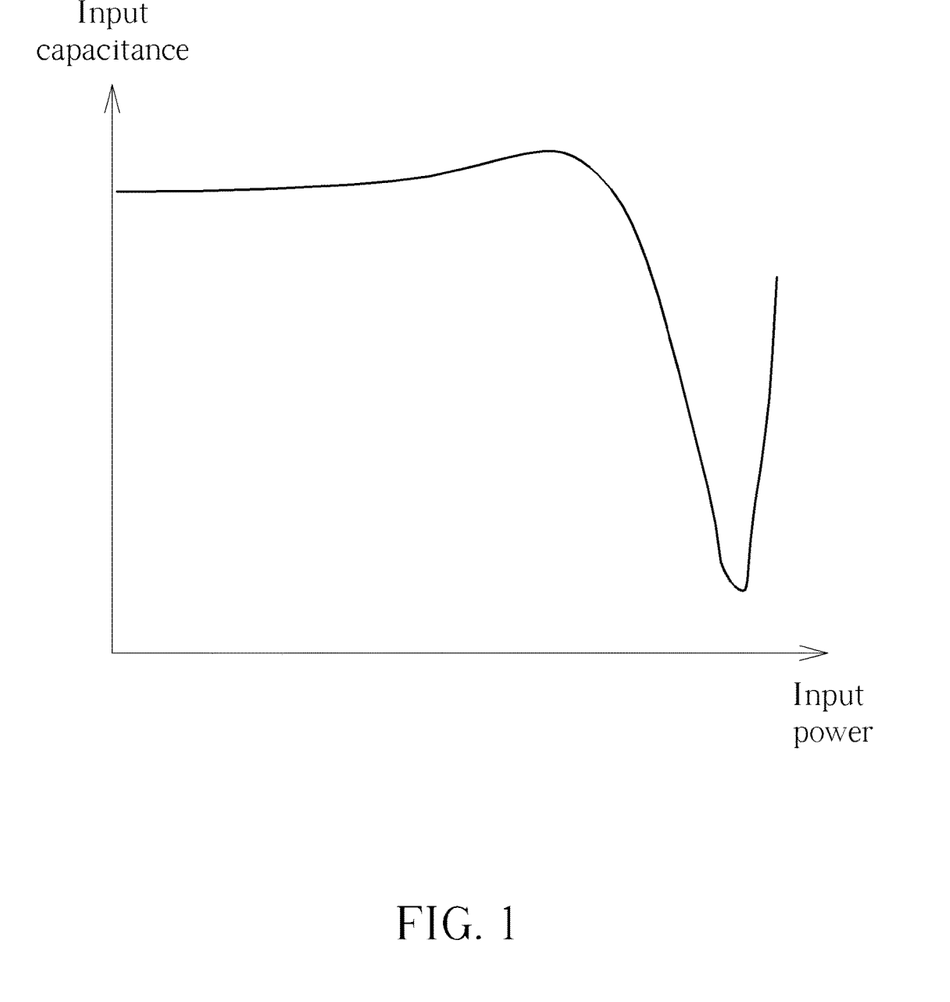
FIG. 1 shows a nonlinear input capacitance of the power amplifier due to the AM-PM distortion.

As a wireless communication system becomes more complicated, a linearity of a power amplifier is more critical, and a spectral re-growth for compensating the power amplifier distortion has more challenge. FIG. 1 shows a nonlinear input capacitance of the power amplifier due to the AM-PM distortion. As shown in FIG. 1, when the input power increases, the input capacitance of the power amplifier may suddenly drop, and the efficiency of the power amplifier may be worsened.

SUMMARY

It is therefore an objective of the present invention to provide a power amplifier system, which can efficiently compensate the nonlinear input capacitance of the power amplifier, to solve the above-mentioned problem.

According to one embodiment of the present invention, a control circuit of a power amplifier comprises a peak detector, at least a first comparator, a first current source, at least a second comparator, a second current source and a bias circuit. The peak detector is arranged for detecting an amplitude of an input signal. The first comparator is coupled to the peak detector, and is arranged for comparing the amplitude of the input signal with a first threshold to generate a first comparing result. The first current source is coupled to the first comparator, and is arranged for generating a first current according to the first comparing result. The second comparator is coupled to the peak detector, and is arranged for comparing the amplitude of the input signal with a second threshold to generate a second comparing result. The second current source is coupled to the second comparator, and is arranged for generating a second current according to the second comparing result. The bias circuit is coupled to the first current source and the second current source, and is arranged for generating a bias voltage according to the first current and the second current to the power amplifier.

According to another embodiment of the present invention, a method for compensating an input capacitance of a power amplifier comprises: detecting an amplitude of an input signal; comparing the amplitude of the input signal with a first threshold to generate a first comparing result; generating a first current according to the first comparing result; comparing the amplitude of the input signal with a second threshold to generate a second comparing result; generating a second current according to the second comparing result; and generating a bias voltage according to the first current and the second current to compensate the input capacitance of the power amplifier.

According to another embodiment of the present invention, a power amplifier system comprises a power amplifier, a varactor and a control circuit, where a first node of the varactor is coupled to an input terminal of the power amplifier; and the control circuit generates a bias voltage according to an amplitude of an input signal to a second node of the varactor, to compensate an input capacitance of the power amplifier.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 2:
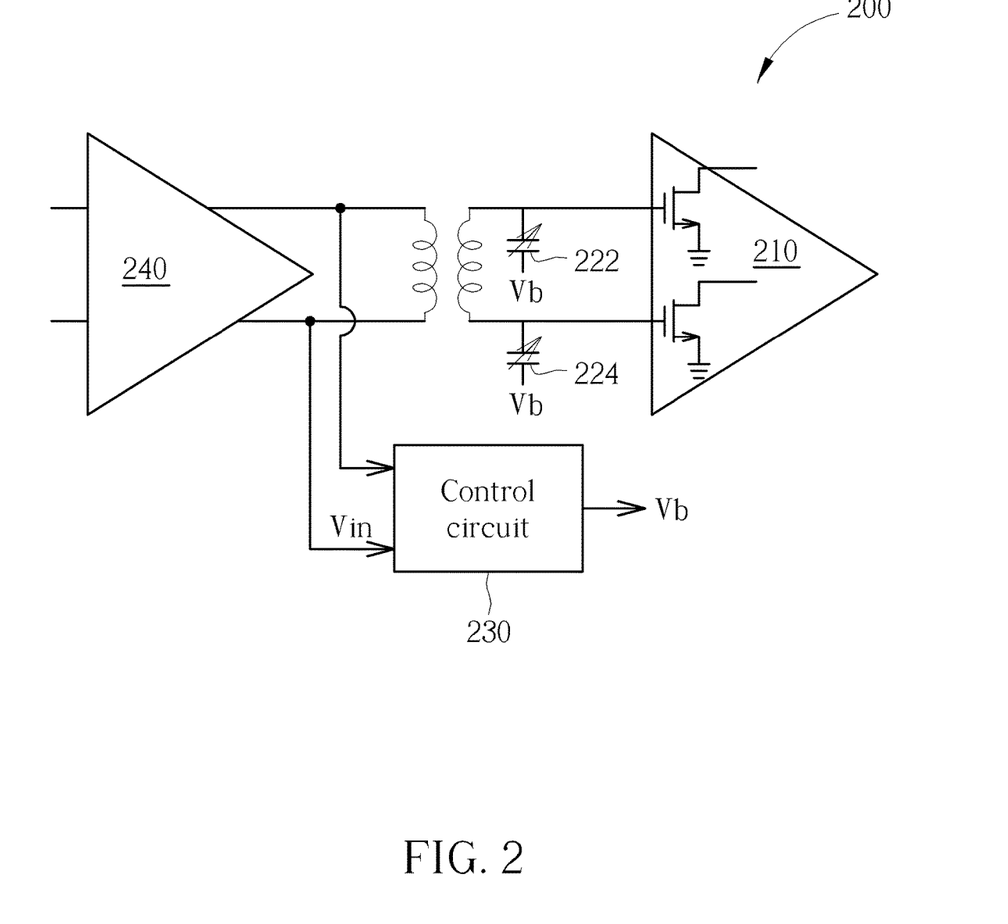
FIG. 2 is a diagram illustrating a power amplifier system according to one embodiment of the present invention.

Please refer to FIG. 2, which is a diagram illustrating a power amplifier system 200 according to one embodiment of the present invention. In FIG. 2, the power amplifier system 200 comprises a power amplifier 210, two varactors (varactor diode) 222 and 224, a control circuit 230 and a driver 240. In the operations of the power amplifier system 200, the power amplifier 210 receives a differential input signal Vin (radio frequency (RF) signal) from the driver 240 to generate a differential output. The control circuit 230 is arranged to receive the input signal Vin to generate a bias voltage Vb, where a voltage level of the bias voltage Vb is changed with a power of the input signal Vin. In this embodiment, a first node of the varactor 222/224 is coupled to an input terminal of the power amplifier 210, which is biased by a fixed DC voltage, and a second node of the varactor 222/224 is biased by the bias voltage Vb generated by the control circuit 230. In light of above, the capacitances of the varactors 222 and 224 are changed in response to the power of the input signal Vin, to compensate the nonlinear input capacitance of the power amplifier 210 shown in FIG. 1.

Figure 3:
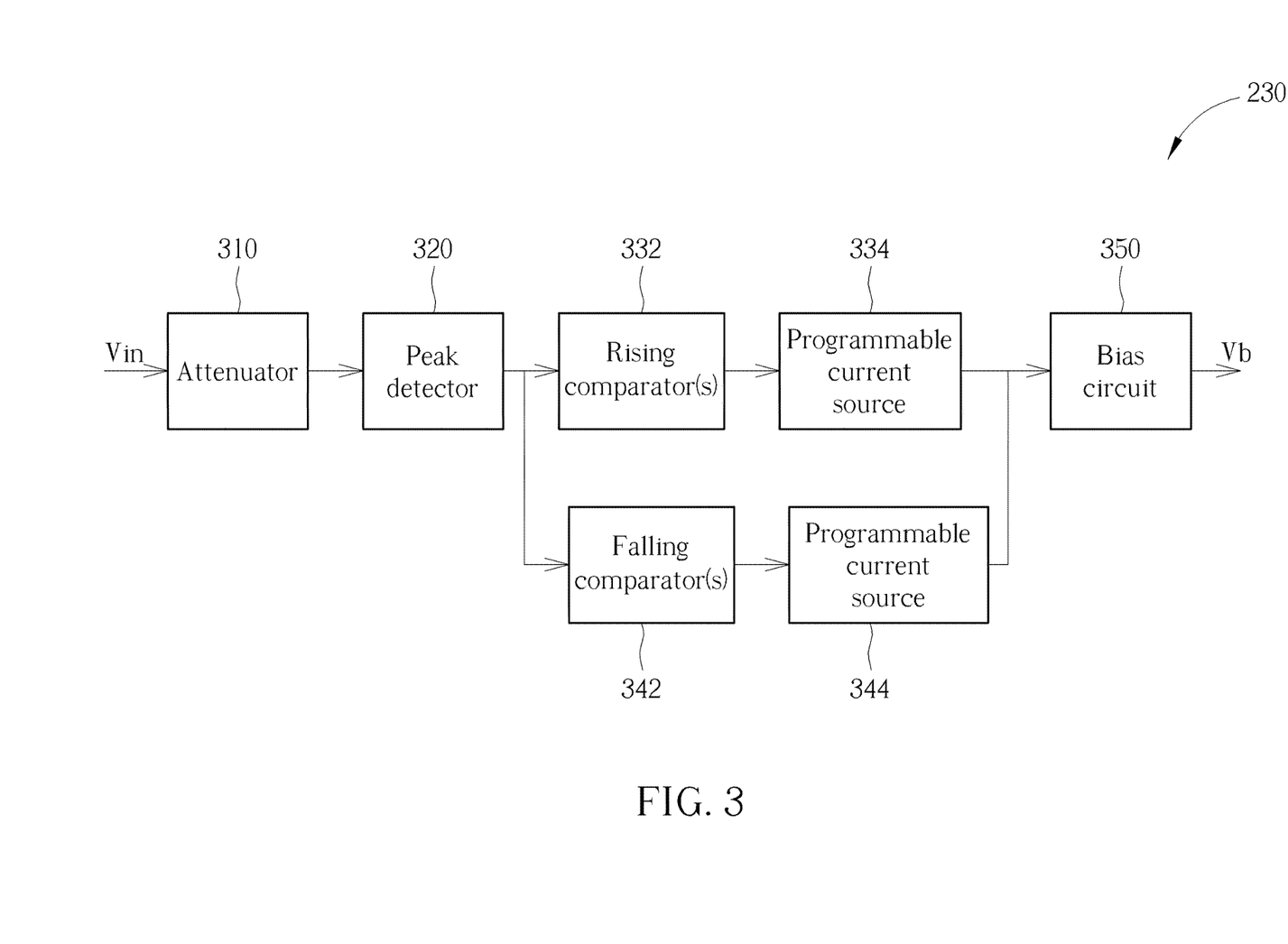
FIG. 3 is a diagram illustrating the control circuit according to one embodiment of the present invention.

Please refer to FIG. 3, which is a diagram illustrating the control circuit 230 according to one embodiment of the present invention. As shown in FIG. 3, the control circuit 230 comprises an attenuator 310, a peak detector 320, one or more rising comparator (s) 332, a programmable current source 334, one or more falling comparator(s) 342, a programmable current source 344, and a bias circuit 350. In the operations of the control circuit 230, first, the attenuator 310 attenuates the input signal Vin. Then, the peak detector 320 detects the amplitude of the attenuated input signal Vin. The rising comparator 332 compares the amplitude of the input signal with a first threshold to generate a first comparing result, and the programmable current source 334 generates a first current according to the first comparing result. The falling comparator 342 compares the amplitude of the input signal with a second threshold to generate a second comparing result, and the programmable current source 344 generates a second current according to the second comparing result. Then, an output current is generated according to the first current and the second current. Finally, the bias circuit 350 performs an I-to-V conversion upon the output current to generate the bias voltage Vb.

Figure 4:
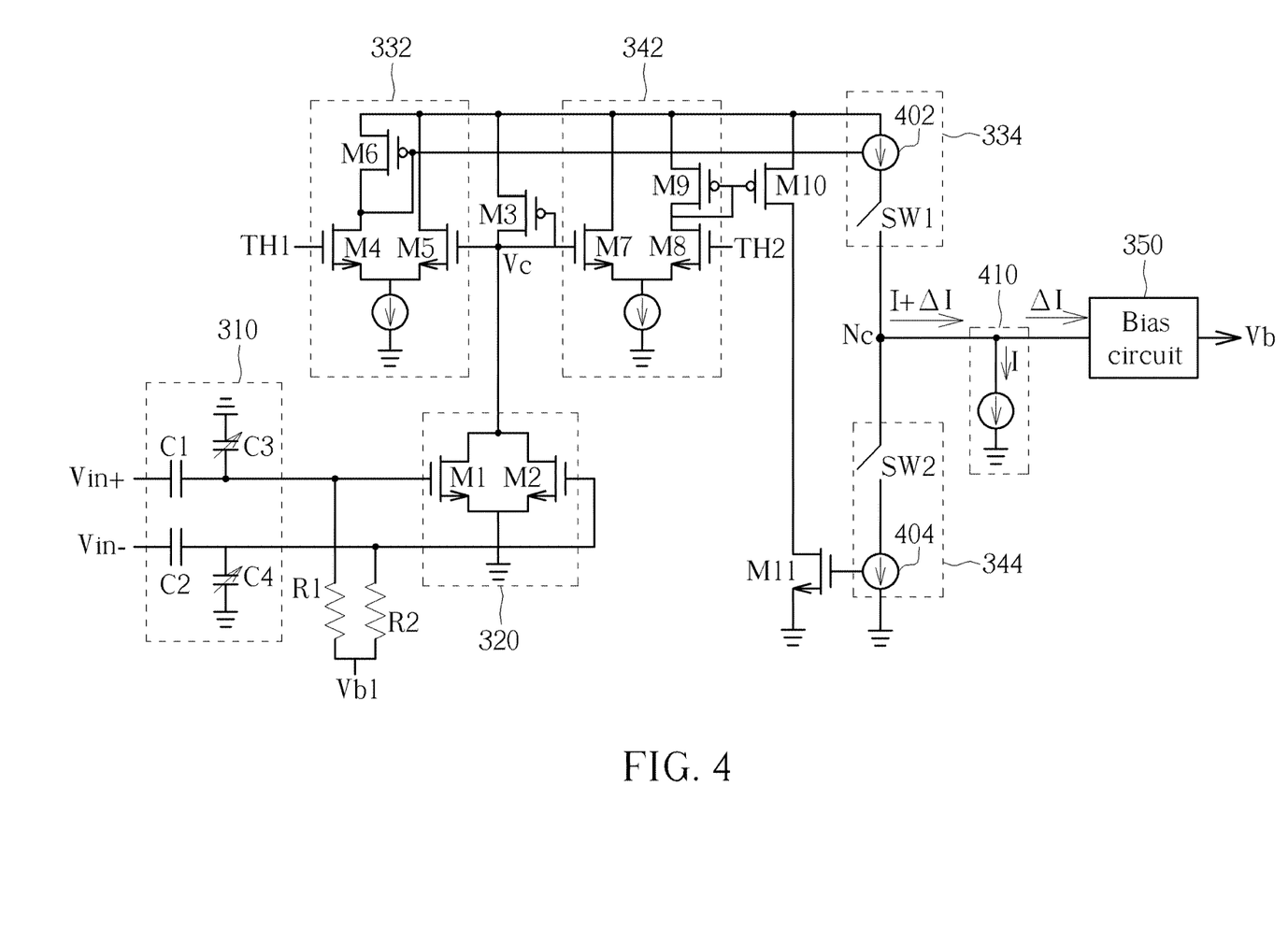
FIG. 4 is a detailed structure of the control circuit according to one embodiment of the present invention.

In detail, FIG. 4 is a detailed structure of the control circuit 230 according to one embodiment of the present invention. As shown in FIG. 4, the input signal may comprise a positive input signal Vin+ and a negative input signal Vin+, and the attenuator 310 can be implemented by a capacitance divider comprising two capacitors C1 and C2 and two variable capacitors C3 and C4. The peak detector 320 comprises two transistors M1 and M2 biased by a voltage Vb1 through resistors R1 and R2, and a voltage Vc of a drain electrode of a transistor M3 is used to represent the amplitude of the input signal Vin (attenuated input signal). The rising comparator 332 is implemented by transistors M4-M6, and the rising comparator 332 compares the voltage Vc with the first threshold TH1 to generate the first comparing result to control/adjust the first current generated by the programmable current source 334, where the programmable current source 334 comprises a current source 402 and a switch SW1. The falling comparator 342 is implemented by transistors M7-M9, and the falling comparator 342 compares the voltage Vc with the second threshold TH2 to generate the second comparing result to control/adjust the second current generated by the programmable current source 344 via transistors M10 and M11, where the programmable current source 344 comprises a current source 404 and a switch SW2. In this embodiment, the programmable current source 334 is used to provide the first current to an output node Nc, and the programmable current source 344 is used to sink the second current from the output node Nc, that is, the output node Nc can be regarded as a combiner to generate an output current by subtracting the second current from the first current. The output current at the output node Nc is represented as "I+ΔI" in FIG. 4. Then, a DC replica circuit 410 is used to remove a DC current (e.g. "I") from the output current "I+ΔI". Finally, the bias circuit 350 performs an I-to-V conversion upon the current "ΔI" to generate the bias voltage Vb.

Figure 5:
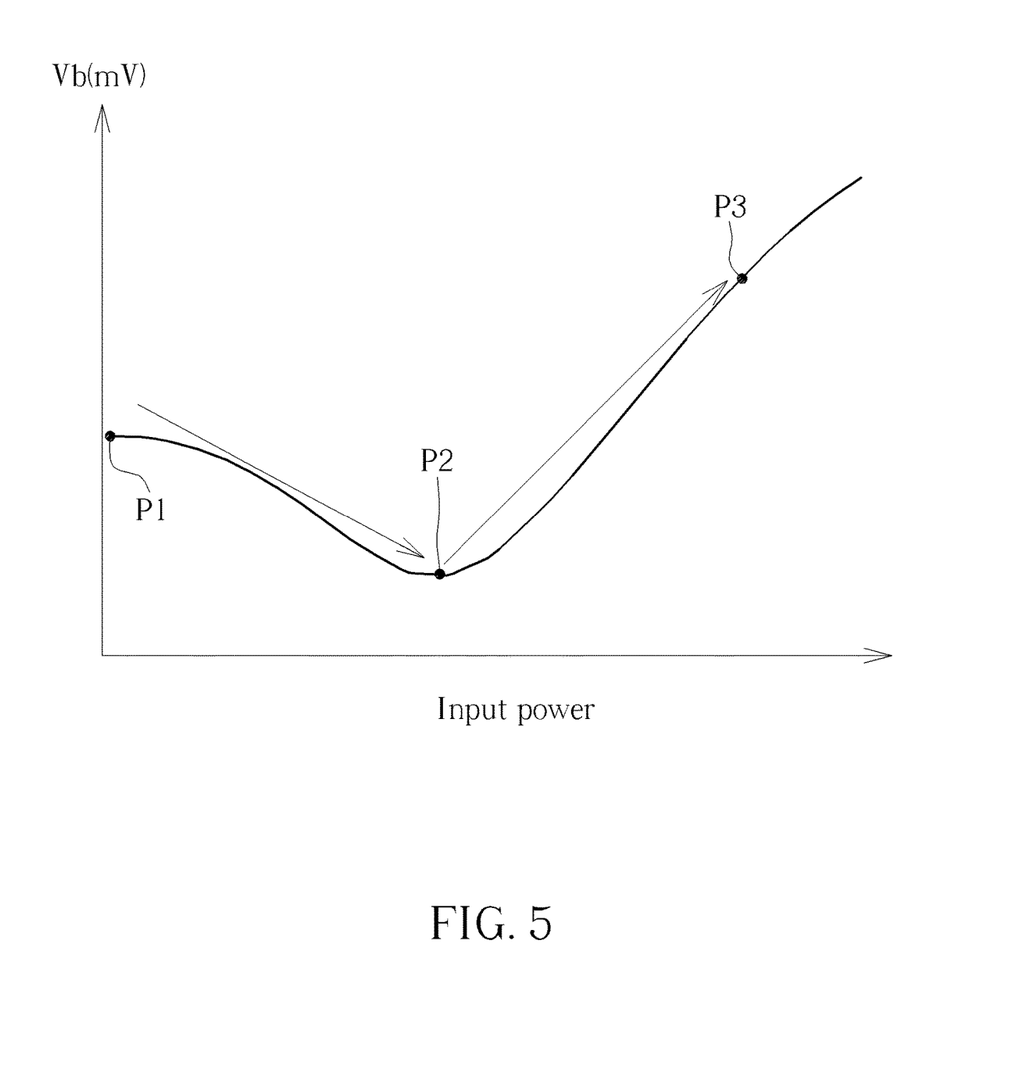
FIG. 5 shows that the bias voltage is changed with the power of the input signal according to one embodiment of the present invention.
Figure 6:
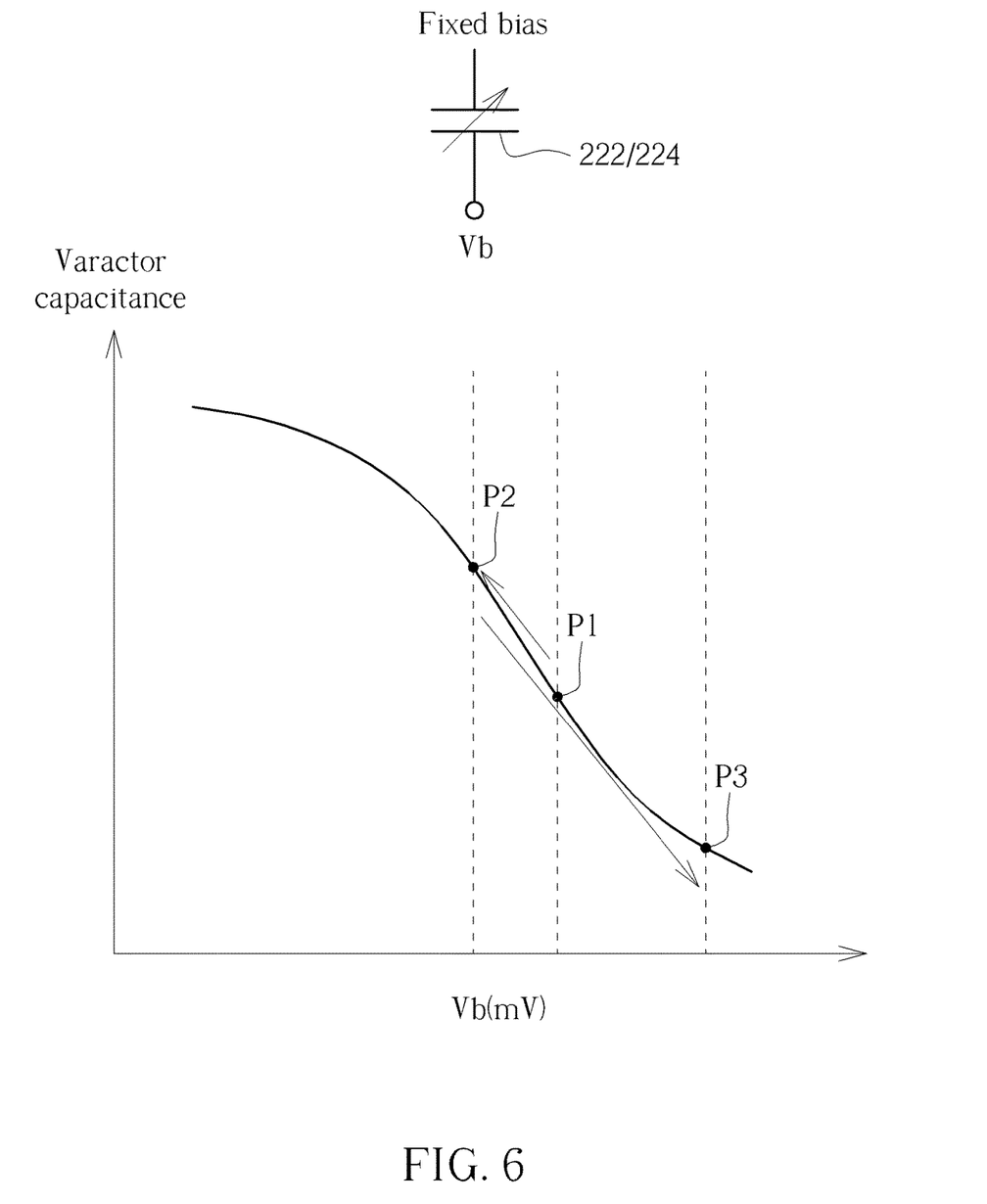
FIG. 6 shows the changes of the capacitance of the varactor when the bias voltage changes with the power of the input signal according to one embodiment of the present invention.

In the embodiment shown in FIG. 4, the first threshold TH1, the second threshold TH2, and currents provided by the current sources 402 and 404 can be set by an engineer to have a suitable input capacitance compensation for the power amplifier 210. For example, the first threshold TH1 may be 0.5V, the second threshold TH2 may be 1V, and the current provided by the current source 402 may be ten times the current provided by the current source 404, and the bias voltage Vb may have a V-shaped curve while the amplifier of the input signal Vin increases as shown in FIG. 5. That is, when the amplifier of the input signal Vin increases, first the output current "I+ΔI" decreases to decrease the bias voltage Vb (from a point P1 to a point P2), and then the output current "I+ΔI" increases to increase the bias voltage Vb (from the point P2 to a point P3). Therefore, because of the special curve of the bias voltage Vb shown in FIG. 5, when the amplifier/power of the input signal Vin continuously increases, the capacitance of the varactors 222 and 224 are increased (from the point P1 to the point P2) to compensate the drop of the input capacitance shown in FIG. 1, and then the capacitance of the varactors 222 and 224 are decreased (from the point P2 to the point P3) as shown in FIG. 6.

By using the embodiments mentioned above, the capacitance of the varactors 222 and 224 can be adaptively controlled to compensate the nonlinearity of the input capacitance (AM-PM distortion) of the power amplifier 210. Therefore, the input capacitance of the power amplifier 210 can be more stable, and the efficiency of the power amplifier 210 can be improved.

In the embodiment shown in FIG. 4, the control circuit 230 does not have any operational amplifier, therefore a bandwidth of the power amplifier system 200 can increase. In addition, because the first threshold TH1, the second threshold TH2, and currents provided by the current sources 402 and 404 are programmable, the engineer can set many different curves (e.g. different positions of the points P1-P3) for the power amplifiers having different nonlinearity input capacitance curves.

In addition, in the embodiments shown in FIG. 2-4, the peak detector 310 is used to detect the amplitude of the input signal Vin outputted by the driver 240. In other embodiments, however, the peak detector 310 can detect an input of the power amplifier 210, or detect an output of the power amplifier 210 to generate a detecting result to the rising comparator 332 and the falling comparator 342. These alternative designs shall fall within the scope of the present invention.

Figure 7:
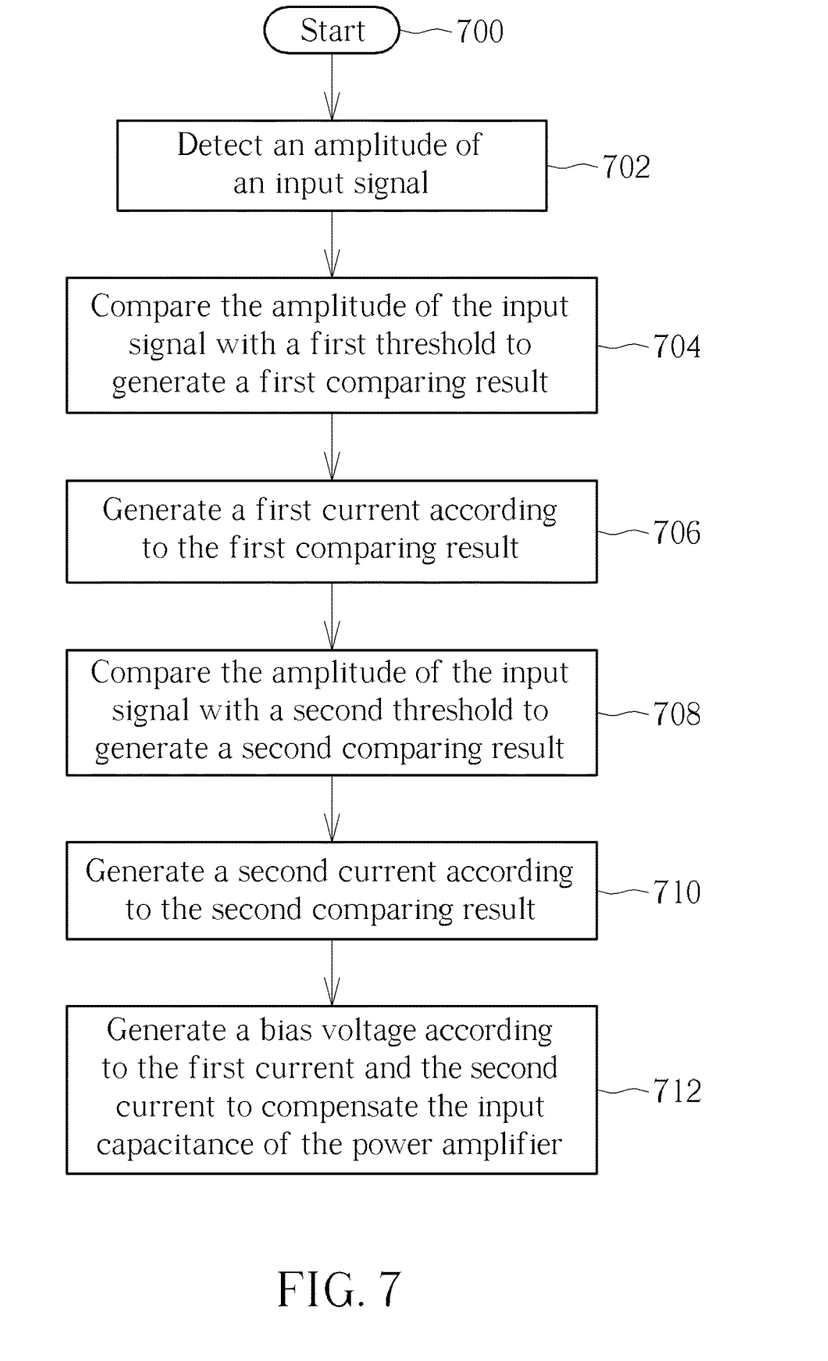
FIG. 7 is a flowchart of a method for compensating an input capacitance of a power amplifier according to one embodiment of the present invention.

Please refer to FIG. 7, which is a flowchart of a method for compensating an input capacitance of a power amplifier according to one embodiment of the present invention. Referring to FIG. 7 and the aforementioned embodiments, the flow is as follows.

Step 700: The flow starts.

Step 702: detect an amplitude of an input signal.

Step 704: compare the amplitude of the input signal with a first threshold to generate a first comparing result.

Step 706: generate a first current according to the first comparing result.

Step 708: compare the amplitude of the input signal with a second threshold to generate a second comparing result.

Step 710: generate a second current according to the second comparing result.

Step 712: generate a bias voltage according to the first current and the second current to compensate the input capacitance of the power amplifier.

Briefly summarized, in the power amplifier system of the present invention, a varactor is used to compensate the nonlinearity of the input capacitance of the power amplifier, and a bias voltage provided to the varactor is determined based on an amplitude/power of a signal associated to the power amplifier. Therefore, the nonlinear input capacitance of the power amplifier can be efficiently compensated.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A control circuit of a power amplifier, comprising:
   a peak detector, for detecting an amplitude of an input signal;
   at least a first comparator, coupled to the peak detector, for comparing the amplitude of the input signal with a first threshold to generate a first comparing result;
   a first current source, coupled to the first comparator, for generating a first current according to the first comparing result;
   at least a second comparator, coupled to the peak detector, for comparing the amplitude of the input signal with a second threshold to generate a second comparing result;
   a second current source, coupled to the second comparator, for generating a second current according to the second comparing result; and
   a bias circuit, coupled to the first current source and the second current source, for generating a bias voltage according to the first current and the second current to the power amplifier.

2. The control circuit of claim 1, wherein the bias circuit generates the bias voltage to a varactor connected to an input terminal of the power amplifier, to control a capacitance of the varactor.

3. The control circuit of claim 2, wherein when the amplitude of the input signal continuously increases, the bias circuit generates the bias voltage to increases the capacitance of the varactor, and then to decrease the capacitance of the varactor.

4. The control circuit of claim 3, wherein a first node of the varactor is connected to the input terminal of the power amplifier, and a second node of the varactor is arranged to receive the bias voltage; and when the amplitude of the input signal continuously increases, first the bias circuit decreases the bias voltage to increase the capacitance of the varactor, and then the bias circuit increases the bias voltage to decrease the capacitance of the varactor.

5. The control circuit of claim 1, wherein the bias circuit generates the bias voltage according to a difference between the first current and the second current.

6. The control circuit of claim 5, further comprising:
   a combiner, coupled between the first current source and the second current source, for generating an output current by subtracting the second current from the first current;
   wherein the bias circuit generates the bias voltage according to the output current.

7. The control circuit of claim 6, wherein when the amplitude of the input signal continuously increases, first the output current decreases to decrease the bias voltage, and then the output current increases to increase the bias voltage, so as to compensate an input capacitance of the power amplifier.

8. The control circuit of claim 7, wherein the bias circuit generates the bias voltage to a varactor connected to an input terminal of the power amplifier, to control a capacitance of the varactor to compensate the input capacitance of the power amplifier.

9. A method for compensating an input capacitance of a power amplifier, comprising:
   detecting an amplitude of an input signal;
   comparing the amplitude of the input signal with a first threshold to generate a first comparing result;
   generating a first current according to the first comparing result;
   comparing the amplitude of the input signal with a second threshold to generate a second comparing result;
   generating a second current according to the second comparing result; and
   generating a bias voltage according to the first current and the second current to compensate the input capacitance of the power amplifier.

10. The method of claim 9, wherein a step of generating the bias voltage comprises:
    generating the bias voltage to a varactor connected to an input terminal of the power amplifier, to control a capacitance of the varactor to compensate the input capacitance of the power amplifier.

11. The method of claim 10, wherein the step of generating the bias voltage comprises:
    when the amplitude of the input signal continuously increases, generating the bias voltage to increase the capacitance of the varactor, and then decreasing the capacitance of the varactor.

12. The method of claim 11, wherein a first node of the varactor is connected to the input terminal of the power amplifier, and a second node of the varactor is arranged to receive the bias voltage, and the step of generating the bias voltage comprises:
    when the amplitude of the input signal continuously increases, first decreasing the bias voltage to increase the capacitance of the varactor, and then increasing the bias voltage to decrease the capacitance of the varactor.

13. The method of claim 9, wherein a step of generating the bias voltage comprises:
    generating the bias voltage according to a difference between the first current and the second current to compensate the input capacitance of the power amplifier.

14. The method of claim 13, wherein the step of generating the bias voltage comprises:
    generating an output current by subtracting the second current from the first current; and
    generating the bias voltage according to the output current.

15. The method of claim 14, wherein a step of generating the output current by subtracting the second current from the first current, and a step of generating the bias voltage according to the output current comprise:
    when the amplitude of the input signal continuously increases, first decreasing the output current to decrease the bias voltage, and then increasing the output current to increase the bias voltage, so as to compensate an input capacitance of the power amplifier.

16. A power amplifier system, comprising:
    a power amplifier;
    a varactor, wherein a first node of the varactor is coupled to an input terminal of the power amplifier; and
    a control circuit, for generating a bias voltage according to an amplitude of an input signal to a second node of the varactor, to compensate an input capacitance of the power amplifier;
    wherein the control circuit comprises:
        a peak detector, for detecting the amplitude of the input signal;
        a comparator module, for comparing the amplitude of the input signal with at least one threshold to generate a comparing result; and a bias circuit, coupled to the comparator module, for generating the bias voltage according to the comparing result.

17. The power amplifier of claim 16, wherein the comparator module comprises:
at least a first comparator, coupled to the peak detector, for comparing the amplitude of the input signal with a first threshold to generate a first comparing result; and
at least a second comparator, coupled to the peak detector, for comparing the amplitude of the input signal with a second threshold to generate a second comparing result;
wherein the bias circuit generates the bias voltage according to the first comparing result and the second comparing result.

18. The power amplifier of claim 16, wherein when the amplitude of the input signal continuously increases, the control circuit generates the bias voltage to increases the capacitance of the varactor, and then decrease the capacitance of the varactor.

19. The power amplifier of claim 17, wherein the first threshold is different from the second threshold.

20. The power amplifier of claim 17, wherein the control circuit further comprises:
a first current source, coupled to the first comparator, for generating a first current according to the first comparing result; and
a second current source, coupled to the second comparator, for generating a second current according to the second comparing result;
wherein the bias circuit generates the bias voltage according to the first current and the second current.

21. A power amplifier system, comprising:
a power amplifier;
a varactor, wherein a first node of the varactor is coupled to an input terminal of the power amplifier; and
a control circuit, for generating a bias voltage according to an amplitude of an input signal to a second node of the varactor, to compensate an input capacitance of the power amplifier;
wherein the control circuit comprises:
a peak detector, for detecting the amplitude of the input signal;
two current sources, for generating a first current and a second current according to the amplitude of the input signal; and
a bias circuit, coupled to the two current sources, for generating the bias voltage according to the first current and the second current.

22. The power amplifier of claim 21, wherein the control circuit further comprises:
at least a first comparator, coupled to the peak detector, for comparing the amplitude of the input signal with a first threshold to generate a first comparing result; and
at least a second comparator, coupled to the peak detector, for comparing the amplitude of the input signal with a second threshold to generate a second comparing result;
wherein the two current source generates the first current and the second current according to the first comparing result and the second comparing result, respectively.

23. The power amplifier of claim 22, wherein the first threshold is different from the second threshold.

24. The power amplifier of claim 21, wherein the bias circuit generates the bias voltage according to a difference between the first current and the second current.

* * * * *